(12) United States Patent
Kim et al.

(10) Patent No.: US 11,837,573 B2
(45) Date of Patent: Dec. 5, 2023

(54) CHIP BONDING APPARATUS AND METHOD OF MANUFACTURING SEMICONDUCTOR DEVICE USING THE APPARATUS

(71) Applicant: Samsung Electronics Co., Ltd., Suwon-si (KR)

(72) Inventors: Junhyung Kim, Yongin-si (KR); Joongha Lee, Suwon-si (KR); Sangha Park, Hwaseong-si (KR); Sunghyup Kim, Hwaseong-si (KR); Kyeongbin Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 211 days.

(21) Appl. No.: 17/166,805

(22) Filed: Feb. 3, 2021

(65) Prior Publication Data

US 2021/0398935 A1 Dec. 23, 2021

(30) Foreign Application Priority Data

Jun. 19, 2020 (KR) ........................ 10-2020-0075189

(51) Int. Cl.
  *H01L 23/00* (2006.01)
(52) U.S. Cl.
  CPC .... *H01L 24/75* (2013.01); *H01L 2224/75252* (2013.01); *H01L 2224/75303* (2013.01); *H01L 2224/75502* (2013.01); *H01L 2924/3511* (2013.01)

(58) Field of Classification Search
  None
  See application file for complete search history.

(56) References Cited

U.S. PATENT DOCUMENTS

| | | | | |
|---|---|---|---|---|
| 5,271,147 A | * | 12/1993 | Ogata | B23K 1/0016 29/827 |
| 5,868,301 A | * | 2/1999 | Distefano | H01L 24/80 228/1.1 |
| 7,176,422 B2 | | 2/2007 | Shi | |

(Continued)

FOREIGN PATENT DOCUMENTS

| | | | | |
|---|---|---|---|---|
| JP | 2004006599 A | * | 1/2004 | ........... H01L 24/743 |
| JP | 2006122726 A | * | 5/2006 | |

(Continued)

*Primary Examiner* — Devang R Patel
(74) *Attorney, Agent, or Firm* — Muir Patent Law, PLLC

(57) ABSTRACT

A chip bonding apparatus includes: a bonding contact configured to apply a bonding force to a semiconductor chip disposed on a substrate, the bonding contact having a first surface configured to face the semiconductor chip and a second surface opposite the first surface, the bonding contact including a protruding portion on the first surface, the protruding portion configured to contact the semiconductor chip, the bonding contact including a cavity formed in a region vertically overlapping the protruding portion, a heater disposed to be in contact with the second surface of the bonding contact to cover the cavity, and configured to heat the bonding contact, a bonding head disposed above the heater and configured to transmit the bonding force, and a partition wall structure protruding from a bottom surface of the cavity to partition an inner space of the cavity.

12 Claims, 14 Drawing Sheets

(56) References Cited

U.S. PATENT DOCUMENTS

| | | | |
|---|---|---|---|
| 8,074,868 B2 | 12/2011 | Maki et al. | |
| 8,307,543 B2 * | 11/2012 | Lee | H01L 24/75 414/737 |
| 9,860,996 B2 | 1/2018 | Interrante et al. | |
| 10,872,875 B2 * | 12/2020 | Lee | H01L 24/73 |
| 2005/0103774 A1 | 5/2005 | Shi | |
| 2011/0175237 A1 * | 7/2011 | Tomura | H01L 23/3142 156/499 |
| 2012/0045869 A1 | 2/2012 | Gaynes et al. | |
| 2013/0032270 A1 | 2/2013 | Mawatari | |
| 2015/0129135 A1 * | 5/2015 | Lee | H01L 24/75 156/583.1 |

FOREIGN PATENT DOCUMENTS

| | | | | |
|---|---|---|---|---|
| JP | 4711527 | B2 | 6/2011 | |
| JP | 2012019096 | A | 1/2012 | |
| JP | 2012199358 | A * | 10/2012 | |
| JP | 2012199358 | A | 10/2012 | |
| JP | 5098939 | B2 | 12/2012 | |
| JP | 2013098264 | A | 5/2013 | |
| JP | 6405999 | B2 | 10/2018 | |
| JP | 6603401 | B2 | 11/2019 | |
| WO | WO-9503685 | A1 * | 2/1995 | B23K 20/025 |

* cited by examiner

CHIP BONDING APPARATUS AND METHOD OF MANUFACTURING SEMICONDUCTOR DEVICE USING THE APPARATUS

CROSS-REFERENCE TO RELATED APPLICATION(S)

This application claims priority under 35 U.S.C. 119 to Korean Patent Application No 10-2020-0075189 filed on Jun. 19, 2020 in the Korean Intellectual Property Office, the disclosure of which is herein incorporated by reference in its entirety.

BACKGROUND

The present inventive concept relates to a chip bonding apparatus and a method of manufacturing a semiconductor device using the chip bonding apparatus.

As electronic products have become smaller, semiconductor chips in a form of flip chips that do not use wire bonding are widely used. In such flip chip-type semiconductor chips, a plurality of electrodes are formed on a lower surface of the semiconductor chips, and are bonded to connection terminals formed on a substrate through solder bumps.

As a method of bonding flip chip-type semiconductor chips, a method of thermal compression bonding is used. Such thermocompression bonding is performed with a bonding tool and a bonding head equipped with a heater by heating a semiconductor chip with a heater while pressing the semiconductor chip with a bonding tool. Therefore, for high mounting quality, it is beneficial to uniformly press and heat the semiconductor chip as a whole and throughout the semiconductor chip. However, in a process in which heat is conducted from the heater to the semiconductor chip through the bonding tool, the semiconductor chip may be unevenly heated by the bonding tool, resulting in deformation or bonding failure of the semiconductor chip.

SUMMARY

An aspect of the present inventive concept is to provide a chip bonding apparatus in which deformation of a semiconductor chip or bonding defects occurring in a semiconductor chip are reduced by uniformly heating a semiconductor chip in a bonding process.

According to an aspect of the present inventive concept, a chip bonding apparatus, includes: a bonding contact configured to apply a bonding force to a semiconductor chip disposed on a substrate, the bonding contact having a first surface configured to face the semiconductor chip and a second surface opposite the first surface, the bonding contact including a protruding portion on the first surface, the protruding portion configured to contact the semiconductor chip, the bonding contact including a cavity formed in a region vertically overlapping the protruding portion, a heater disposed to be in contact with the second surface of the bonding contact to cover the cavity, and configured to heat the bonding contact, a bonding head disposed above the heater and configured to transmit the bonding force, and a partition wall structure protruding from a bottom surface of the cavity to partition an inner space of the cavity.

According to an aspect of the present inventive concept, a chip bonding apparatus, includes: a bonding tool having a first surface configured to contact an object to be bonded and a second surface opposite the first surface, the second surface having a first region in which a cavity is formed and a second region disposed at a periphery of the first region, a heater disposed to be in contact with the second surface to cover the cavity of the bonding tool and configured to heat the bonding tool, and a partition wall structure protruding from a bottom surface of the cavity to partition an internal space of the cavity into a plurality of regions, the partition wall structure positioned at a lower level than the second surface.

According to an aspect of the present inventive concept, a chip bonding apparatus, includes: a heater having a first surface and a second surface opposite the first surface, the heater including a first region and a second region spaced apart from each other by a first trench penetrating through the first and second surfaces, the first region configured to be heated to a first temperature, the second region disposed at a periphery of the first region and configured to be heated to a second temperature higher than the first temperature, a bonding tool having a third surface in contact with the first surface and having a second trench extending from the first trench, and a fourth surface opposite the third surface and configured to contact an object to be bonded to apply a bonding load to the object, and a bonding head disposed on the second surface of the heater, the bonding head configured to transmit the bonding load to the object through the heater.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, embodiments of the present inventive concept will be described with reference to the accompanying drawings.

Figure 1:
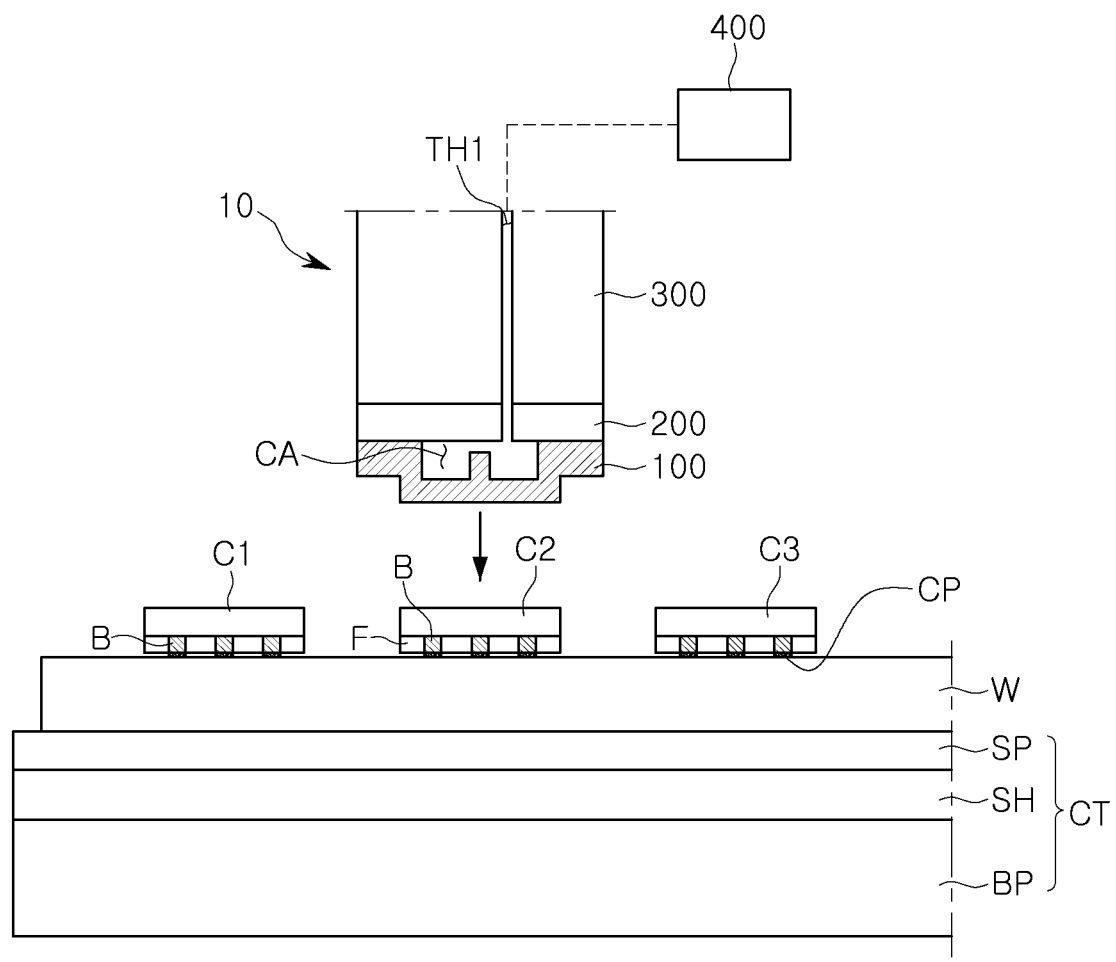
FIG. 1 is a schematic side view of a chip bonding apparatus according to an example embodiment of the present inventive concept.
Figure 2:
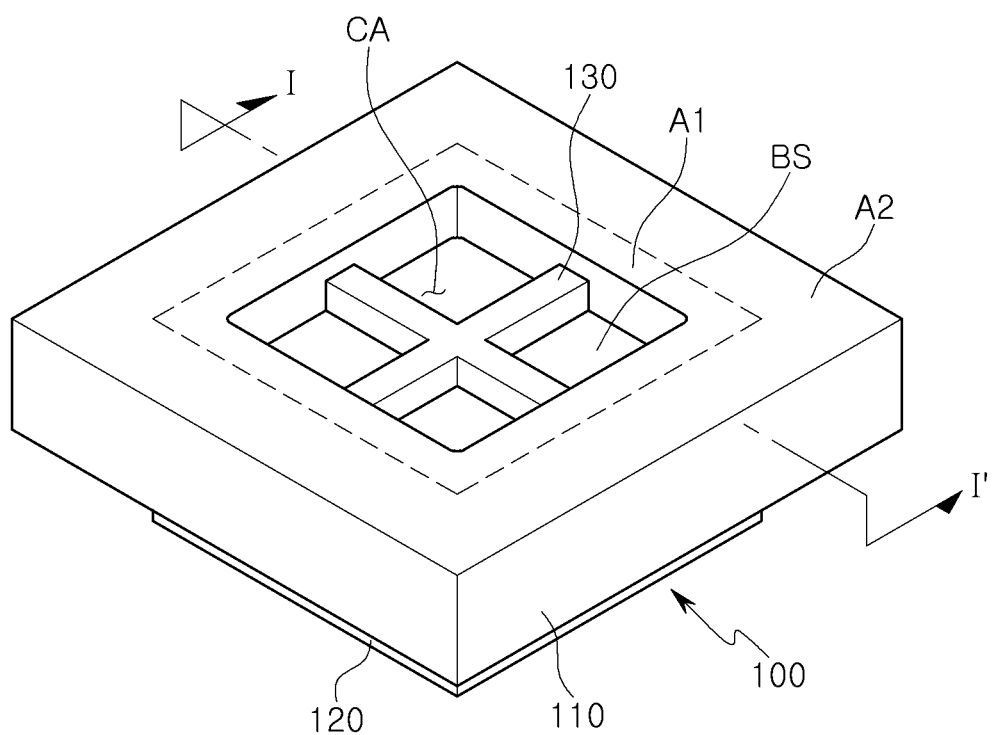
FIG. 2 is a perspective view of the bonding tool shown in FIG. 1.
Figure 3:
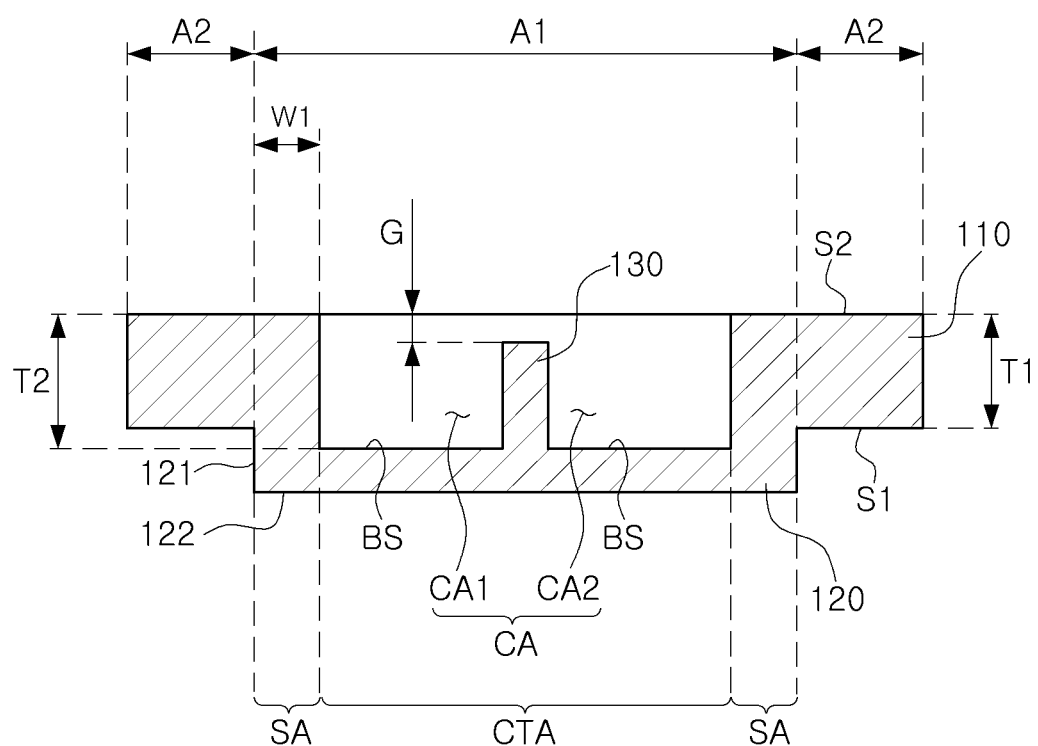
FIG. 3 is a side cross-sectional view taken along line I-I' of FIG. 2.

FIG. 1 is a schematic side view of a chip bonding apparatus according to an example embodiment of the present inventive concept, FIG. 2 is a perspective view of the bonding tool shown in FIG. 1, and FIG. 3 is a side cross-sectional view taken along line I-I' of FIG. 2.

Referring to FIG. 1, a chip bonding apparatus 10 according to the present example embodiment is an apparatus for bonding and mounting semiconductor chips C1, C2, and C3 as an object to be bonded to a substrate W such as a wafer. The chip bonding apparatus 10 may include a bonding tool 100, a heater 200 and a bonding head 300. The bonding tool 100 may transfer heat and pressure to semiconductor chips C1, C2, and C3 to thermally compress the semiconductor chips C1, C2 and C3. The bonding tool 100 may have a cavity CA on one surface. The heater 200 may cover the cavity CA and may be connected to the bonding tool 100 to transfer heat to the semiconductor chips C1, C2 and C3 through the bonding tool 100. The bonding head 300 may be connected to the heater 200 to transfer pressure to the bonding tool 100 through the heater 200. The pressure transferred to the bonding tool 100 may be transferred to the semiconductor chips C1, C2 and C3. The bonding tool 100 may be formed of a heat-conductive material, for example, a metal or a compound of metal, such as aluminum, stainless steel, titanium, chromium, tungsten, etc. The chip bonding apparatus 10 may further include a through-hole TH1 penetrating through the heater 200 and the bonding head 300, and a pressure control unit 400 connected to the through-hole TH1 to inject or exhaust gas into or from the cavity CA to adjust internal pressure of the cavity CA. For example, the pressure control unit 400 may be a pressure controller or a pressure supply adjusting and/or supplying the internal pressure of the cavity CA.

The substrate W to which the semiconductor chips C1, C2, and C3 are bonded may be mounted on a stage CT such as a chuck table. In an example embodiment, the substrate W may have undergone a chemical mechanical polishing process such that a connection terminal CP is exposed on a mounting surface on which the semiconductor chips C1, C2, and C3 will be attached.

The stage CT may include a base plate BP, a stage heater SH heating the substrate W to a predetermined temperature, and a stage plate SP disposed on the stage heater SH and on which the substrate W is mounted. A solder bump B may be located below the semiconductor chips C1, C2, and C3, and the solder bump B may be disposed below the semiconductor chips C1, C2, and C3 while being fixed by a bonding film F. For example, solder bumps B may be attached on the bonding film F, and the solder bumps B may be disposed under the semiconductor chips C1, C2 and C3 together with the bonding film F. When the semiconductor chips C1, C2, and C3 are pressed by the chip bonding apparatus 10, the bonding film F may melt in a bonding region to which the semiconductor chips C1, C2, and C3 are bonded, seal/fill a space between the semiconductor chips C1, C2, and C3 and a substrate W, and bond the substrate W and the semiconductor chips C1, C2, and C3.

The bonding head 300 may move in an X-axis, Y-axis, and Z-axis by a driving device, and may move the bonding tool 100 so that the plurality of semiconductor chips C1, C2, and C3 are sequentially bonded on the substrate W by thermocompression bonding. In an example embodiment, the bonding head 300 may apply a bonding load of 100 to 300N to the bonding tool 100. For example, the bonding load may be a force to press the semiconductor chips C1, C2, and C3 to bond on the substrate W. For example, the bonding load may correspond to a bonding force to apply pressure on the semiconductor chips C1, C2 and C3.

The heater 200 may be located between the bonding head 300 and the bonding tool 100 to transmit a bonding load applied from the bonding head 300 to the bonding tool 100 thereunder, and may heat the bonding tool 100. In an example embodiment, the heater 200 may be a multilayer ceramic heater. In addition, the heater 200 may be disposed to be in contact with a second surface S2 of the bonding tool 100 to cover the cavity CA of the bonding tool 100. The heater 200 may be heated to a range of about 25° C. to 500° C., and in an example embodiment, the heater 200 may be heated to a temperature of about 300° C.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The bonding tool 100 may move up and down according to the movement of the bonding head 300 to sequentially thermally press the semiconductor chips C1, C2, and C3 disposed on the substrate W, e.g., by a thermocompression bonding process. The bonding tool 100 may heat the semiconductor chips C1, C2, and C3 to melt the solder bump B disposed below the semiconductor chips C1, C2, and C3 to electrically connect the semiconductor chips C1, C2, and C3 to connection terminals CP of the substrate W. The bonding tool 100 may be described as a bonding contact, or bonding cap (e.g., that forms a cap on the chip bonding apparatus 10, formed on an end of a body that includes the bonding head 300, the heater, and the bonding tool 100).

Referring to FIGS. 2 and 3, when viewed from above (e.g., in a plan view), the bonding tool 100 may have a rectangular shape, have a first surface S1 and a second surface S2, opposite each other, and may have a body portion 110 having a predetermined thickness T1. For example, an edge of the body portion 110 may have the thickness T1 in a vertical direction. A cavity CA may be formed in the second surface S2 of the body portion 110, and a protruding portion 120 may be disposed/formed on the first surface S1 thereof. A lower surface 122 of the protruding portion 120 may be provided to have a larger area than the semiconductor chips C1, C2, and C3, but is not limited thereto, and according to example embodiments, the protruding portion 120 may also have the same area as the semiconductor chips C1, C2, and C3. For example, the cavity CA may be formed in the body portion 110 and may have a rectangular bottom surface having four sides, and side surfaces of the cavity CA may extend upward from the four side surfaces of the bottom surface.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The cavity CA may be limitedly disposed in a first region A1, which is a region, overlapping the protruding portion 120 of the second surface S2. For example, the cavity CA may be formed in the first region A1 of the bonding tool 100, and the cavity CA may be limited to the first region A1. The first region A1 of the bonding tool 100 may be a region vertically overlapping the protruding portion 120 of the bonding tool 100. The cavity CA may have a shape corresponding to the protruding portion 120 and may have an area smaller than that of the protruding portion 120, e.g., in a plan view. A region disposed at a periphery of the first region A1 may be defined as a second region A2, a region in which the cavity CA is not disposed. For example, the second region A2 may be a region which does not vertically overlap the protruding portion 120. A bottom surface BS of the cavity CA may be formed as a flat surface, an inclined surface or a curved surface according to example embodiments.

Since the heater 200 is disposed on the second surface S2 of the bonding tool 100 to cover the cavity CA, the cavity CA may maintain a sealed structure. For example, the cavity CA may be isolated from outside by the bonding tool 100 and the heater 200. A partition wall structure 130 reinforcing rigidity of the cavity CA and dividing an internal space may be disposed inside the cavity CA. The partition wall structure 130 may protrude from the bottom surface BS of the cavity CA. In certain embodiments, the partition wall structure 130 may be disposed above the bottom surface BS of the cavity CA. In an example embodiment, the cavity CA may have a height/depth T2 of 0.5 mm to 1.5 mm (e.g., a height/depth having a value between 0.5 mm and 1.5 mm), and a sidewall 121 of the cavity CA may have a thickness W1 in a horizontal direction equal to 10% to 20% of a total length of the protruding portion 120. For example, the total length of the protruding portion may be a length of the protruding portion 120 in a horizontal direction and in a direction perpendicular to a side surface of the bonding tool 100. The cavity CA may be disposed in a region overlapping the protruding portion 120 to prevent heat transferred from the heater 200 from being directly transferred to the central region CTA of the protruding portion 120, and to prevent heat from being concentrated in the central region CTA of the protruding portion 120 by allowing heat to be transferred through the peripheral region SA. For example, the cavity CA may prevent heat from being directly and vertically transferred to the central region CTA. When a cavity is not disposed in a bonding tool, the heat conducted from a heater is conducted from a second surface of the bonding tool to a first surface through a central region of the bonding tool. Thus, the peripheral region SA of the protruding portion is deprived of heat through the sidewall 121, such that it is cooled relatively faster than the central region CTA. Therefore, when there is no cavity CA in the bonding tool 100, the temperature of the central region CTA of the protruding portion 120 is higher than the temperature of the peripheral region SA, and thus a heat distribution imbalance between the central region and the peripheral region may cause temperature imbalance between the central region and a peripheral region of the bonded semiconductor chips C1, C2, and C2. If the heat distribution imbalance occurs, deformation such as warpage of the semiconductor chips may occur in the process of bonding the semiconductor chips C1, C2, and C3, and also, the deformed semiconductor chips C1, C2, and C3 may cause defects due to abnormal/improper bonding. In an example embodiment, heat may be prevented from being concentrated in the central region CTA of the protruding portion 120 by the cavity CA, so that the temperature deviation of the protruding portion 120 may be greatly reduced. For example, the cavity CA may be beneficial for a relatively uniform temperature distribution throughout the bottom surface of the protruding portion 120. This will be described in detail later.

An inside of the cavity CA may be filled with air. However, the present inventive concept is not limited thereto, and a gas having low thermal conductivity, such as argon gas or nitrogen gas, may be filled in the cavity, or a mixture of these gases may be filled in the cavity.

A partition wall structure 130 may be formed to protrude from the bottom surface BS of the cavity CA, and may be disposed across the bottom surface BS to partition the cavity CA into a plurality of regions. The partition wall structure 130 may have a rib structure connecting side surfaces of the cavity CA, facing each other, and the partition wall structure 130 may be beneficial to effectively prevent the sidewall 121 from being damaged by the pressure transmitted from the bonding head 300. For example, each partition wall of the partition wall structure 130 may connect a pair of sidewalls 121 facing each other among the sidewalls 121 of the cavity CA. For example, the partition wall structure may have a cross or lattice shape as shown in FIG. 2. For example, the partition wall structure 130 may divide inner space of the cavity CA, and may be formed in a point symmetrical manner or a rotationally symmetrical manner with respect to the center of the cavity in a plan view.

For example, the partition wall structure 130 may be disposed at a lower level than the second surface S2, and may be disposed to have a gap G of 0.2 mm to 0.5 mm from the second surface S2. For example, the gap G may be a height difference between the second surface S2 and an upper surface (e.g., a top surface) of the partition wall structure 130. Due to this structure, an upper portion of the partition wall structure 130 may be disposed so as not to contact the heater 200, so that heat from the heater 200 may not be directly transmitted to the partition wall structure 130 and to the protruding portion 120 through the partition wall structure 130. In addition, the upper portion of the partition wall structure 130 may be disposed to have a gap G with the heater 200, so that respective regions CA1 and CA2 of the cavity partitioned by the partition wall structure 130 may be connected to each other to have the same internal pressure.

Depending on the example embodiment, a through-hole TH1 penetrating through the bonding head 300 and the heater 200 may be formed, and the through-hole TH1 may be connected to a pressure control unit 400, and a gas or air disposed in the cavity CA may be removed through the through-hole TH1 to reduce the internal pressure of the cavity CA, or a gas or air may be injected into the cavity CA to increase the internal pressure of the cavity CA. Thereby, the pressure applied to the semiconductor chips C1, C2, and C3 from the protruding portion 120 may be locally adjusted. For example, since the pressure applied from the protruding portion 120 may be prevented from being concentrated to the peripheral region SA, uniform pressure may be transferred to the semiconductor chips C1, C2, and C3 as a whole.

Figure 4A:
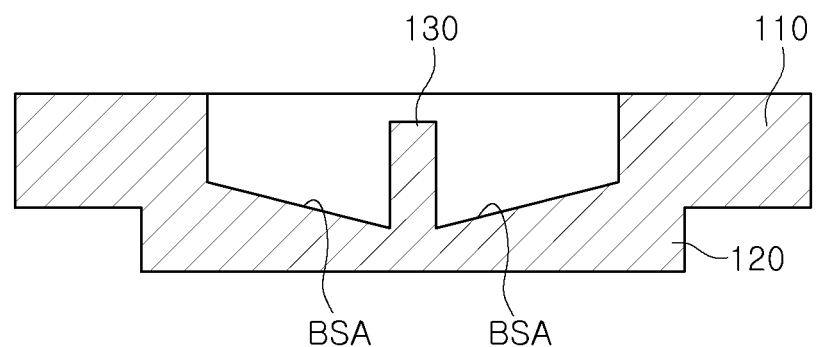
FIGS. 4A and 4B are cross-sectional views illustrating various bonding tools that can be employed in the chip bonding apparatus according to an example embodiment of the present inventive concept.
Figure 4B:
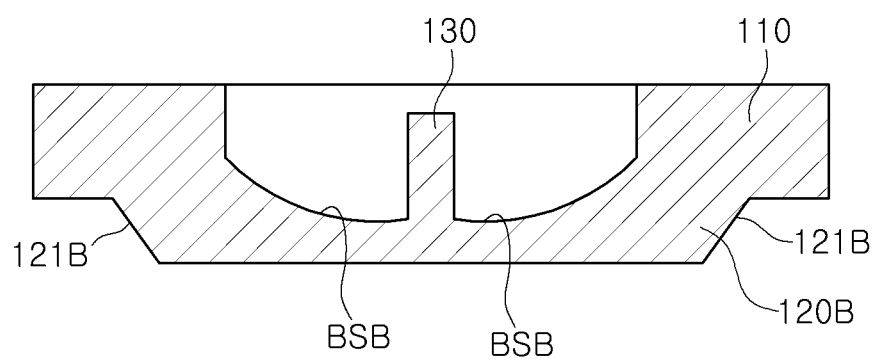

FIGS. 4A and 4B are cross-sectional views illustrating various bonding tools that can be employed in the chip bonding apparatus according to an example embodiment.

FIG. 4A illustrates a case in which a bottom surface BSA of the cavity CA of the bonding tool 100A is formed as an inclined surface inclined downwardly toward the central region, e.g., in a direction approaching the central region of the bottom surface BSA. FIG. 4B illustrates a case in which a bottom surface BSB of the cavity CA of the bonding tool 100B is formed as a concave surface and/or a curved surface (e.g., a concavely curved surface) inclined downwardly toward the central region, e.g., in a direction approaching the central region of the bottom surface BSB. In the case of the bonding tool 100B of FIG. 4B, a side surface 121B of the protruding portion 120B is formed as an inclined surface, so that the rigidity of the protruding portion 120B may be further improved. For example, the cavity CA may have a varying depth within a range between 0.5 mm and 1.5 mm.

Figure 5:
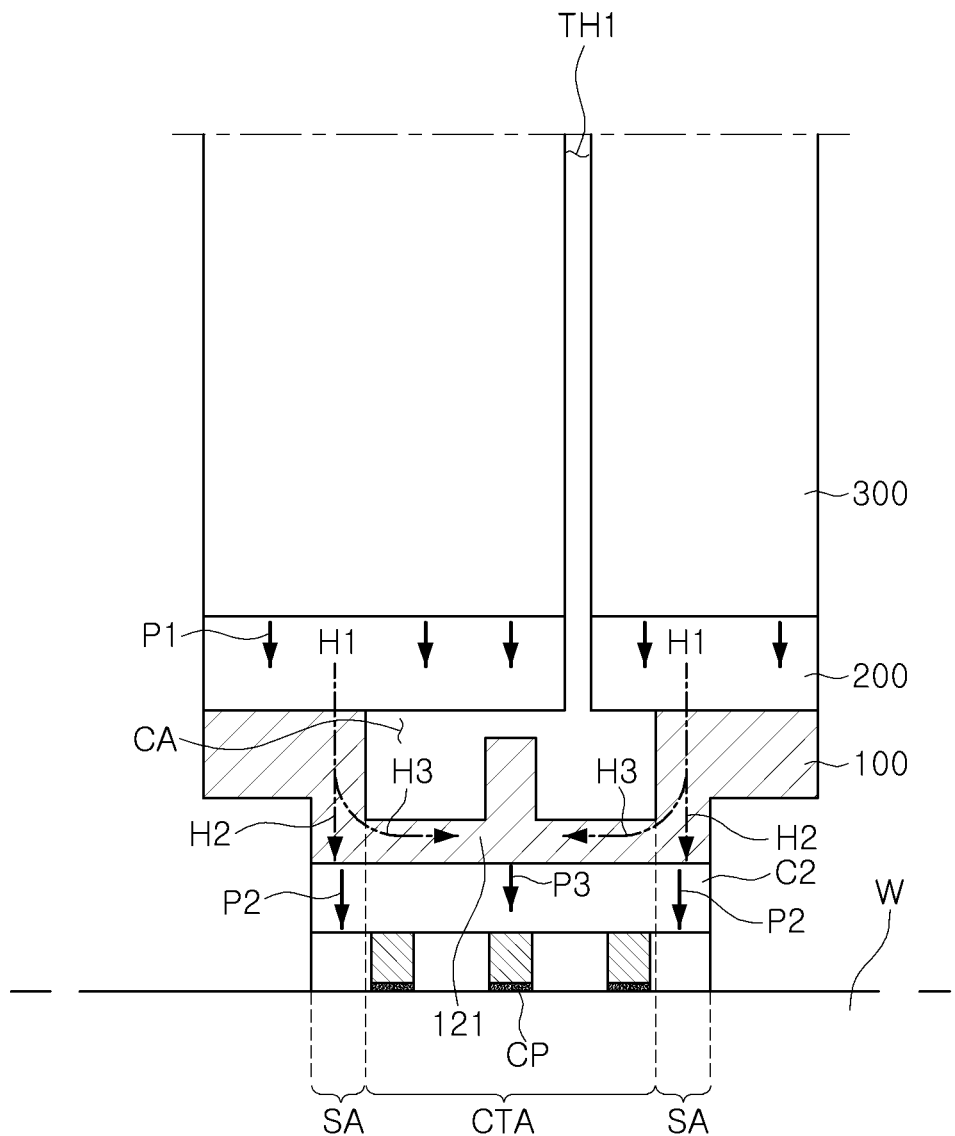
FIG. 5 is a view illustrating a process of bonding a chip with the chip bonding apparatus of FIG. 1.
Figure 6A:
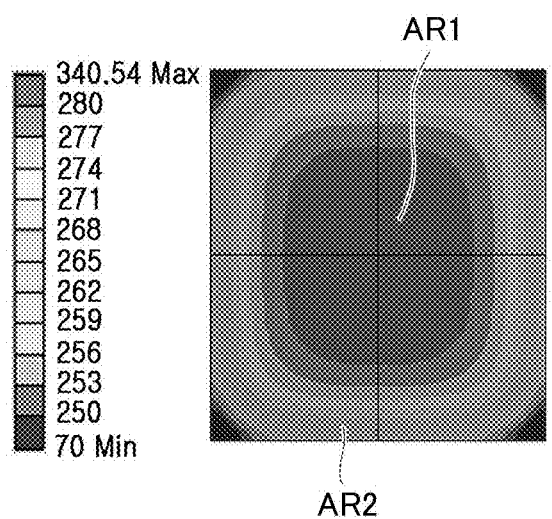
FIGS. 6A and 6B are graphs of surface temperature of a chip bonded by a chip bonding apparatus according to a comparative example and an example of the present inventive concept.
Figure 6B:
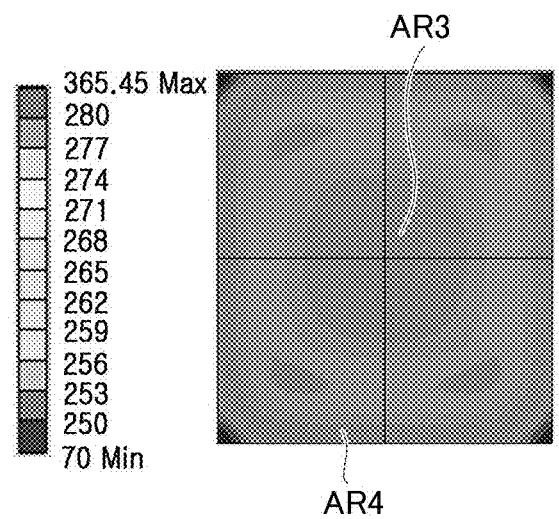

FIG. 5 is a view illustrating a process of bonding the semiconductor chip C2 with the chip bonding apparatus 10 of FIG. 1, and FIGS. 6A and 6B are graphs of surface temperatures of a semiconductor chip bonded by a chip bonding apparatus according to a comparative example and an example embodiment of the present inventive concept respectively.

Referring to FIG. 5, first pressure P1 applied from the bonding head 300 may be transferred to the bonding tool 100 through the heater 200, but may be distributed and transmitted to second pressure P2 applied to a lower portion of a surrounding region SA and third pressure P3 applied to the lower portion of the central region CTA, due to the cavity CA formed in a central region CTA.

Due to the cavity CA, the heat H1 transferred from the heater 200 may not directly be transferred to the central region CTA of the protruding portion 120 but may be transferred to the peripheral region SA and to the central region CTA through the peripheral region SA. For example, direct heat transferred from the heater 200 to the central region CTA of the protruding portion 120 may be blocked by the cavity CA, and the heat transferred through the peripheral region SA of the protruding region 120 may be distributed and conducted to the central region CTA. Therefore, the heat distribution imbalance in which the temperature of the central region CTA of the protruding portion 120 is relatively high may be improved/prevented.

FIG. 6A is a comparative example, showing a surface temperature distribution of a semiconductor chip bonded by a chip bonding apparatus in which no cavity is formed in the protruding portion. It was measured that the central region AR1 of the bonded semiconductor chip was 283° C. and the peripheral region AR2 was 260° C. Therefore, the temperature deviation of the central region AR1 from the peripheral region AR2 was 23° C.

On the other hand, in the case of an example embodiment, the central region AR3 of the bonded semiconductor chip was measured to be 264° C., and the peripheral region AR4 was measured to be 265° C. Therefore, the temperature deviation of the central region AR3 from the peripheral region AR4 was 1° C., and the temperature difference between the central region and the peripheral region was reduced in the example embodiment compared to the comparative example. Accordingly, the example embodiment has an effect of reducing the temperature deviation of the bonded semiconductor chip compared to the comparative example. In addition, since the heater 200 is prevented from being unnecessarily heated, there is an effect of reducing energy consumed in a thermocompression bonding process.

Figure 7:
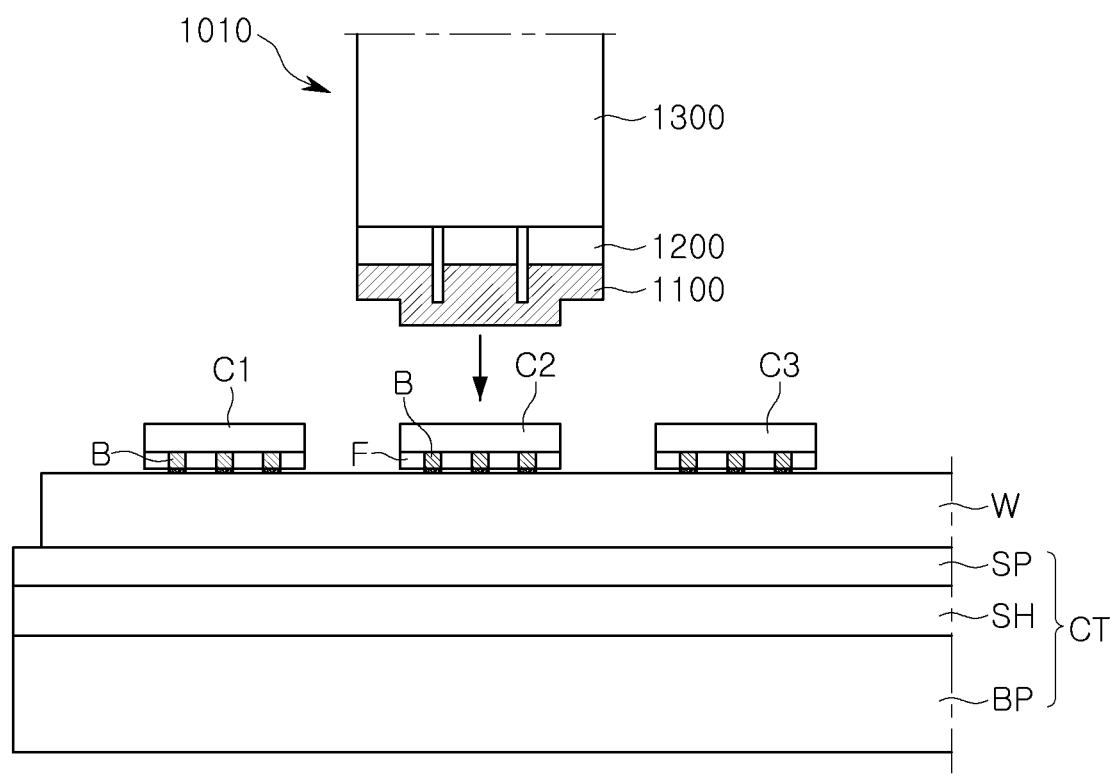
FIG. 7 is a schematic side view of a chip bonding apparatus according to an example embodiment of the present inventive concept.
Figure 8:
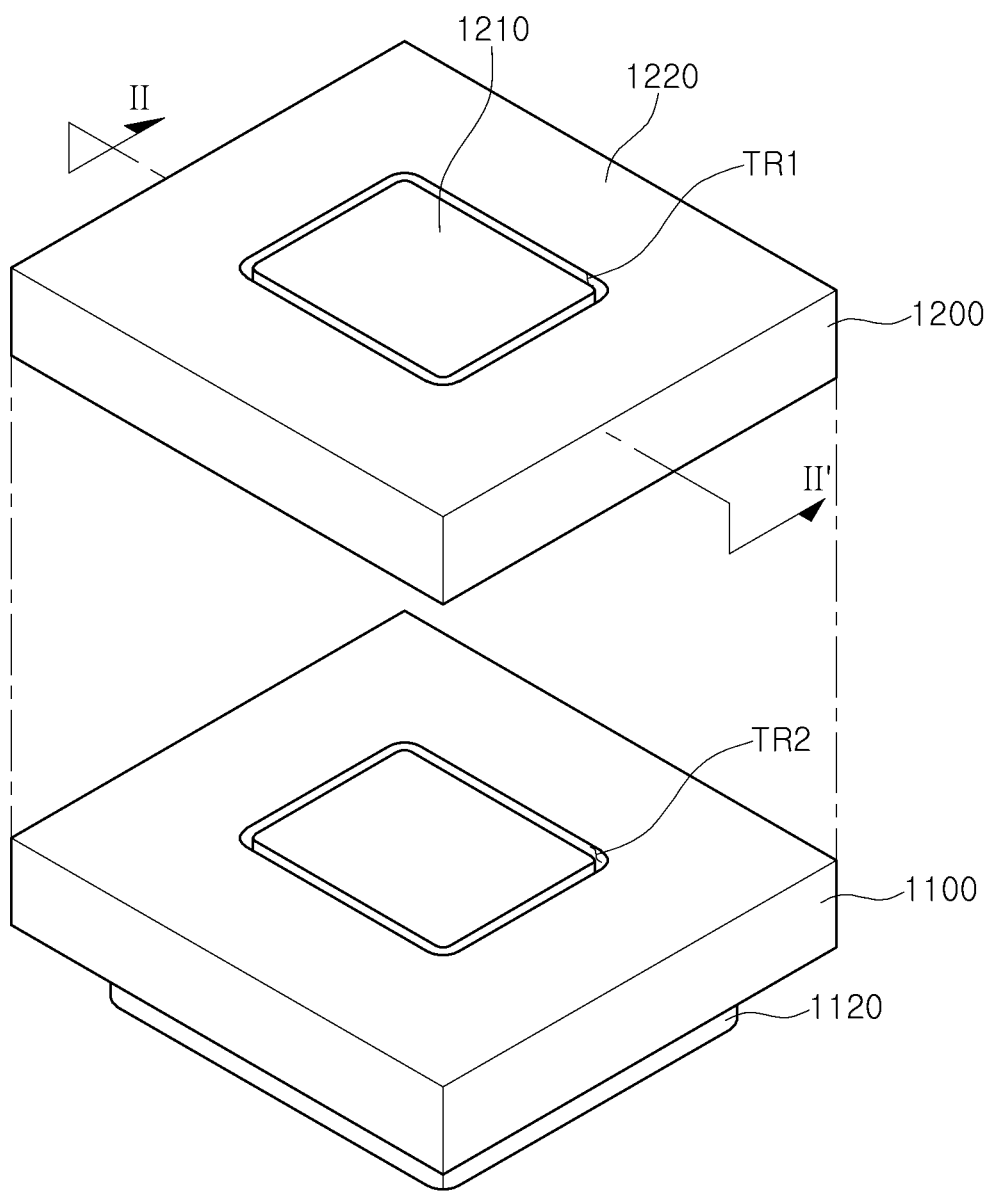
FIG. 8 is a partially exploded perspective view illustrating the heater and the bonding tool shown in FIG. 7.
Figure 9:
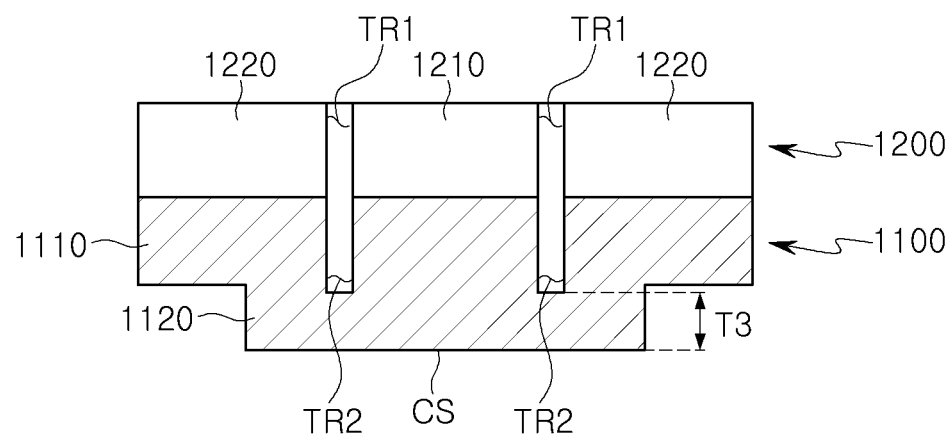
FIG. 9 is a side cross-sectional view taken along line II-II' of FIG. 8.

FIG. 7 is a schematic side view of a chip bonding apparatus according to an example embodiment of the present inventive concept, FIG. 8 is a partially exploded perspective view illustrating the heater and the bonding tool shown in FIG. 7, and FIG. 9 is a side cross-sectional view taken along line II-II' of FIG. 8.

Referring to FIGS. 7 and 8, a chip bonding apparatus 1010 according to an example embodiment of the present inventive concept is different from the example embodiments described above, e.g., with respect to FIG. 1 in that a heater 1200 includes a plurality of regions spaced apart from each other, and a trench TR2 is formed in the bonding tool 1100 where vertically corresponding regions to the spaced apart portions between the plurality of regions of the heater 1200. An opening or a trench TR1 is formed between the separated regions. Other configurations are the same as those of the previously described embodiment, and thus detailed descriptions thereof are omitted.

Referring to FIG. 7, the chip bonding apparatus 1010 according to the present example embodiment may include a bonding tool 1100 for performing a thermocompression process on semiconductor chips C1, C2, and C3, a heater 1200 for heating the bonding tool 1100, and a bonding head 1300 connected to the heater 1200 to transmit pressure to the bonding tool 1100.

Referring to FIGS. 8 and 9, the heater 1200 may have a first region 1210 and a second region 1220 separated from each other by a first trench TR1. The first region 1210 may be disposed in a region vertically overlapping a protruding portion 1120, and the second region 1220 may be disposed at a periphery of the first region 1210. The first region 1210 may be heated to a relatively lower temperature than the second region 1220. For example, the first region 1210 may be heated to 280° C., and the second region 1220 may be heated to 300° C. Accordingly, the heater 1200 may heat the bonding tool 1100 connected thereunder to a different temperature for each region.

The bonding tool 1100 connected to the lower portion of the heater 1200 may have a second trench TR2 formed to extend from the first trench TR1, and the second trench TR2 may be formed to a predetermined depth/distance T3 from a surface (CS) of the protruding portion 1120. For example, the side surfaces of the first trench TR1 may be coplanar with the side surfaces of the second trench TR2.

Figure 10:
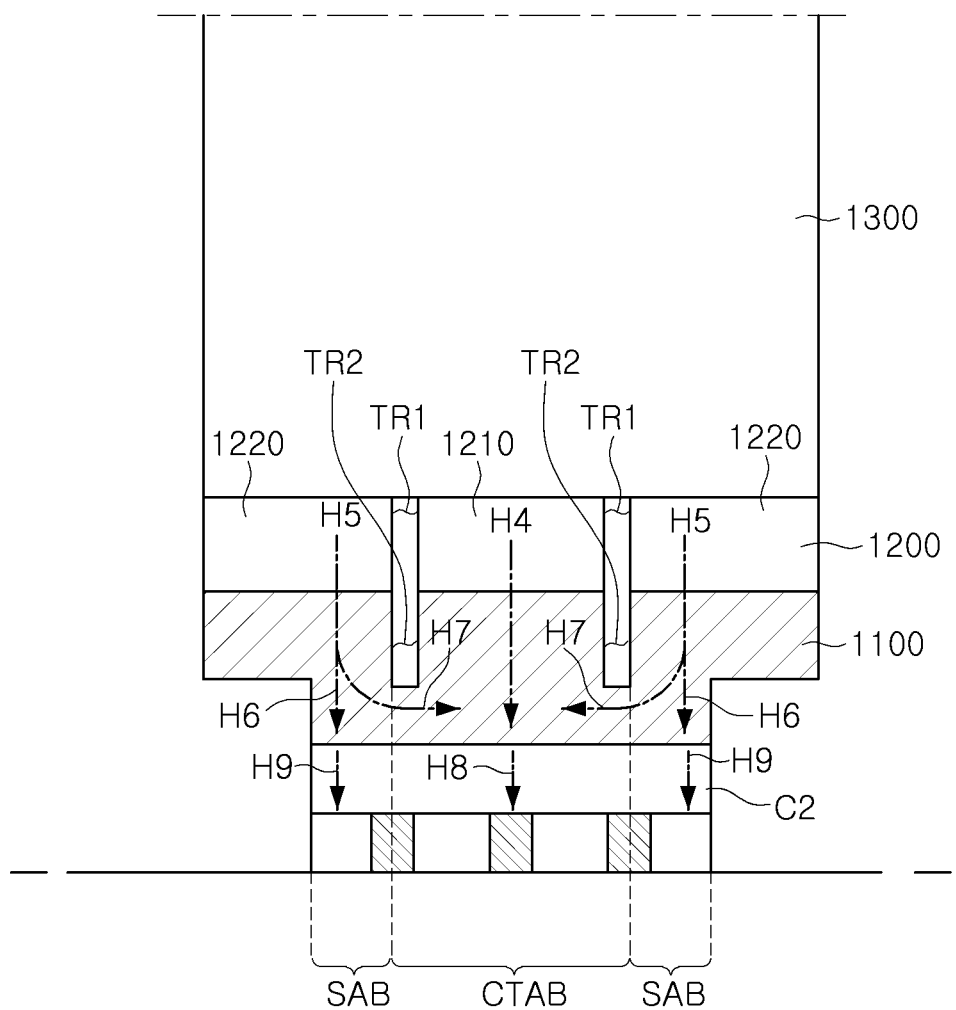
FIG. 10 is a view illustrating a process of bonding a chip with the chip bonding apparatus of FIG. 8.

Due to this structure, heat emitted from the first region 1210 and the second region 1220 of the heater 1200 may be separately conducted to each region of the bonding tool 1100. This will be described in detail with reference to FIG. 10. FIG. 10 is a view illustrating a process of bonding a chip with the chip bonding apparatus of FIG. 8.

Referring to FIG. 10, first heat H4 applied from a first region 1210 of the heater 1200 may be a temperature lower than second heat H5 applied to the second region 1220. The second heat H5 is dispersed/divided into third heat H6 conducted to a peripheral region SAB of a bonding tool 1100 and fourth heat H7 conducted to a central region CTAB. The first heat H4 conducted through the central region CTAB of the bonding tool 1100 is combined with the fourth heat H7 and conducted to be the fifth heat H8 in the central region CTAB of a semiconductor chip C2. In addition, the third heat H6 is conducted to be the sixth heat H9 in the peripheral region SAB of the semiconductor chip C2 as the sixth heat H9.

For example, since the first heat H4 and the second heat H5 are separately conducted because of a first trench TR1, the second heat H5 generated from the second region 1220 of the heater 1200 may not be directly conducted to the first region 1210 of the heater 1200. In addition, since the fourth heat H7, which is a part of the second heat H5, is combined with the first heat H4 and is conducted to be the fifth heat H8 in the central region CTAB of the semiconductor chip C2, and only the sixth heat H9 is conducted to the peripheral region SAB of the semiconductor chip C2, the deviation of heat applied to the semiconductor chip C2 may be reduced.

Figure 14A:
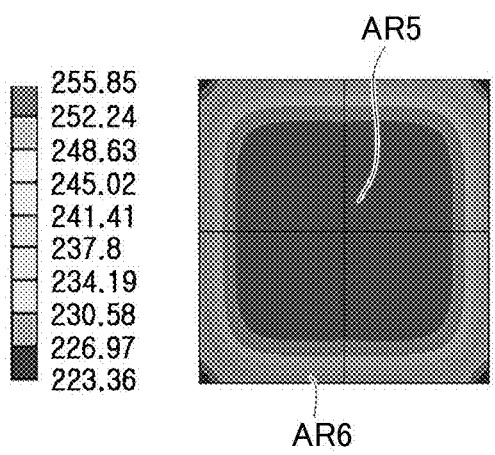
FIG. 14A is a graph illustrating surface temperature of a chip boned with a chip bonding apparatus according to a comparative example of the present inventive concept.
Figure 14B:
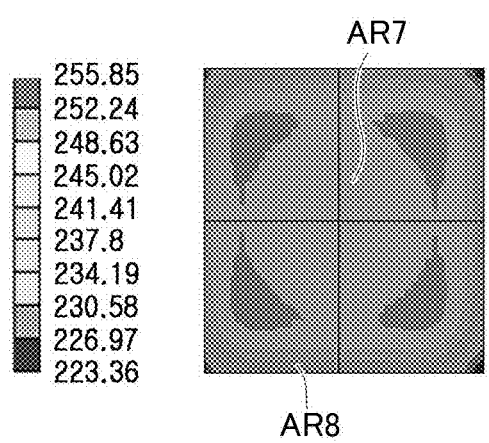
FIG. 14B is a graph illustrating surface temperature of a chip boned with a chip bonding apparatus according to an example embodiment of the present inventive concept.

FIGS. 14A and 14B are graphs of surface temperatures of a chip bonded by a chip bonding apparatus of a comparative example and a chip bonding device according to an example embodiment of the present inventive concept shown in FIG. 8 respectively.

FIG. 14A is a comparative example, showing a surface temperature distribution of a semiconductor chip bonded by a chip bonding apparatus in which a heater is formed of one region. For example, the temperature of the heater is not controlled locally but controlled as a whole. A central region AR5 of the bonded semiconductor chip was measured to be 255° C., and a peripheral region AR6 was measured to be 240° C. Therefore, a temperature deviation of the central region AR5 from the peripheral region AR6 reached 15° C.

On the other hand, in an example embodiment, it was measured that a central region AR7 of the bonded semiconductor chip was 246° C. and a peripheral region AR8 was 240° C. Therefore, the temperature deviation of the central region AR7 from the peripheral region AR8 is reduced to 6° C. The temperature difference between the central region and the peripheral region is reduced as compared to the comparative example, thereby having a relatively uniform temperature distribution as a whole/throughout the measured chip.

Figure 11A:
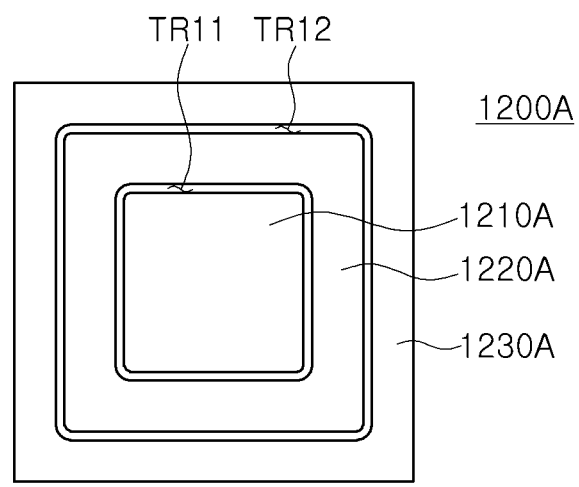
FIGS. 11A and 11B are overhead cross-sectional views illustrating various heaters that can be employed in the chip bonding apparatus according to example embodiments of the present inventive concept.
Figure 11B:
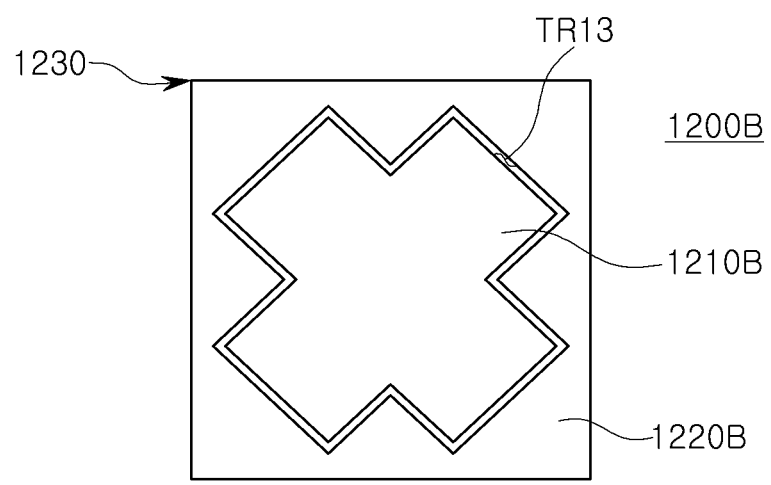

A trench partitioning the heater into a plurality of regions may have various shapes. FIGS. 11A and 11B are overhead cross-sectional views (or plan views) illustrating various heaters that can be employed in the chip bonding apparatus according to example embodiments of the present inventive concept.

FIG. 11A shows an example in which two trenches TR11 and TR12 are formed in a heater 1200A, and the heater 1200A is partitioned into three regions 1210A, 1220A, and 1230A. Compared to the example embodiment described above, e.g., with respect to FIG. 7, since the heat generated from the heater 1200A can be further subdivided and conducted separately, the temperature distribution can be more precisely controlled.

FIG. 11B shows an example in which a trench TR13 is expanded to be close to each vertex region 1230 and/or peripheral area of the heater 1200B. This kind of partition design may further reduce a temperature deviation between each vertex region 1230 of the heater 1200B and other regions.

Figure 12:
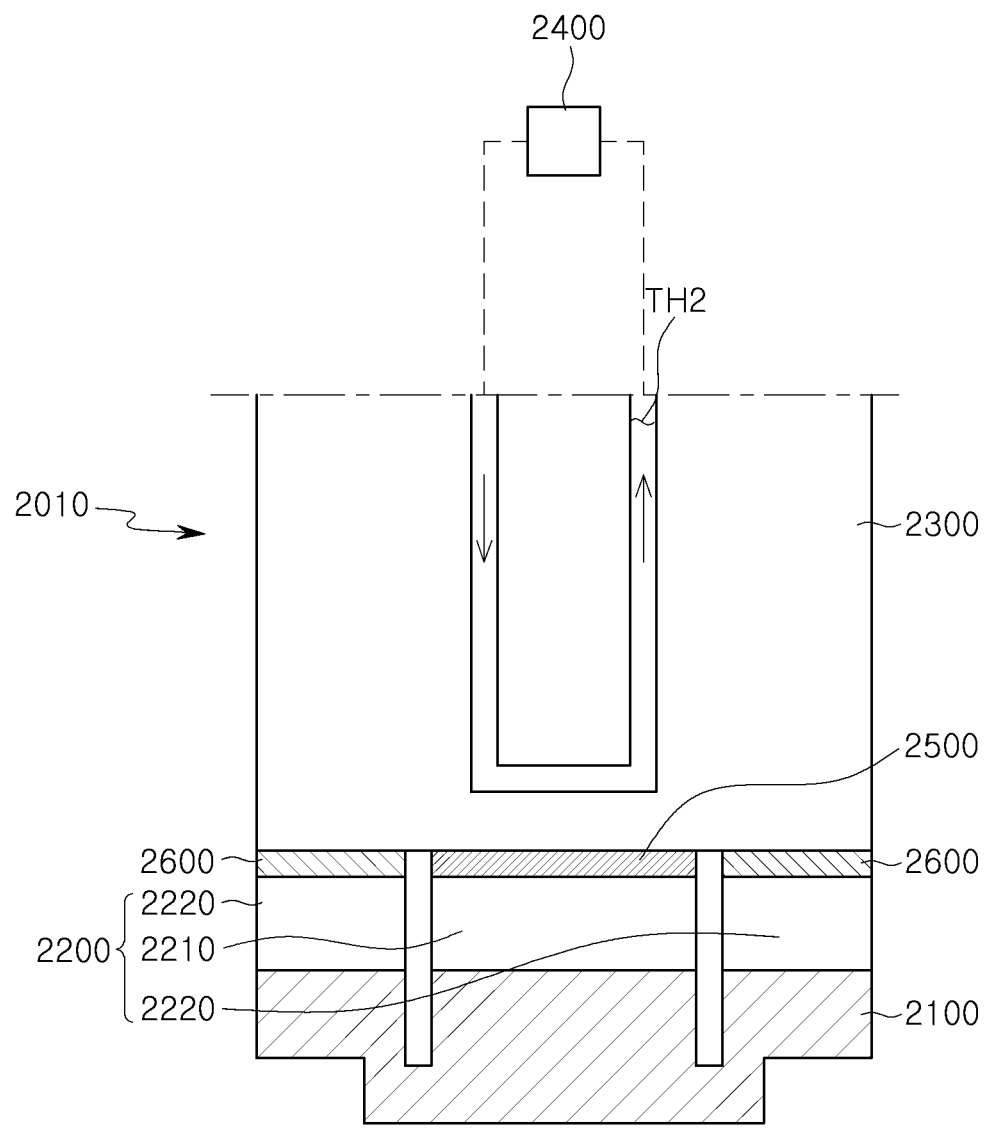
FIGS. 12 and 13 illustrate various examples of the chip bonding apparatus according to example embodiments of the present inventive concept.
Figure 13:
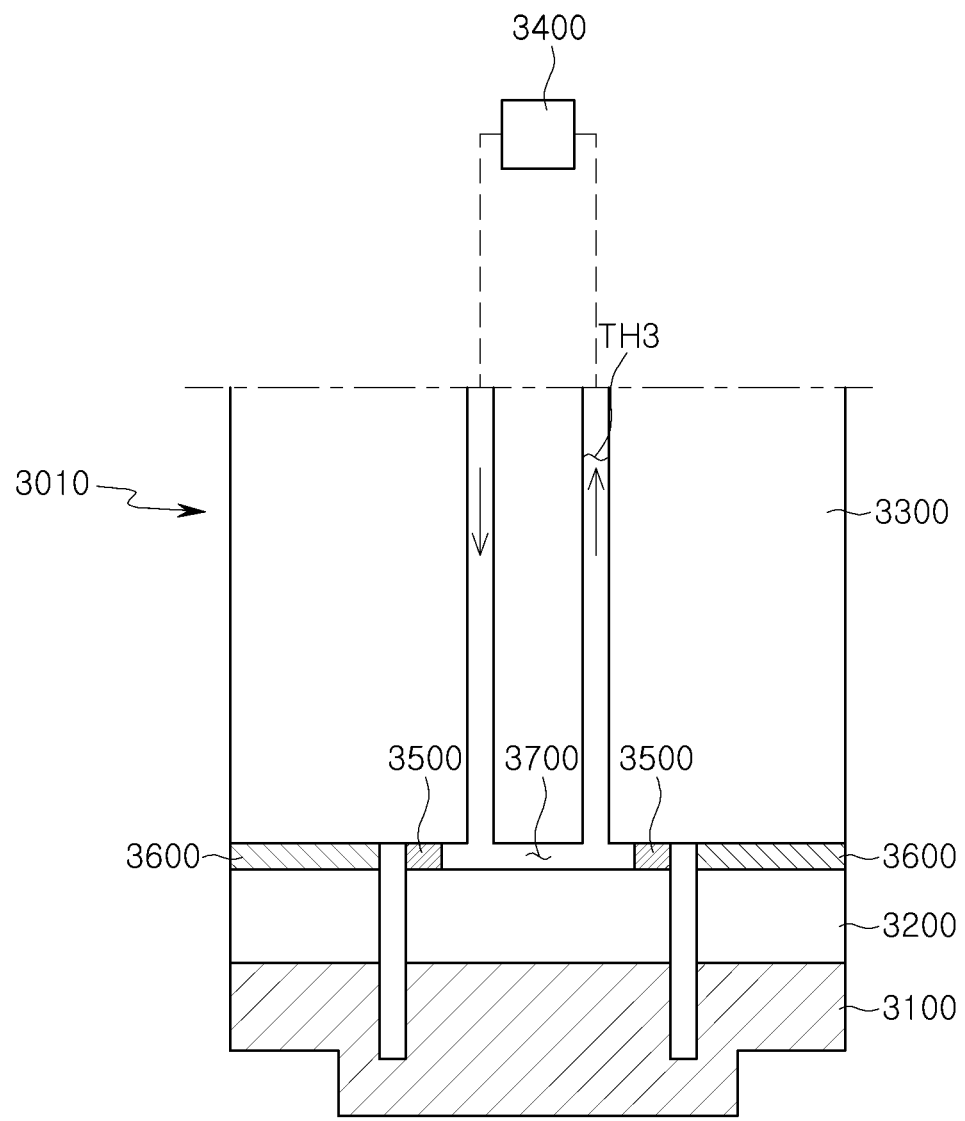

FIGS. 12 and 13 show various examples of a chip bonding apparatus according to example embodiments of the present inventive concept.

In the chip bonding apparatus 2010 of FIG. 12, heat conductive layers 2500 and 2600 are further disposed between the heater 2200 and the bonding head 2300. The heat conductive layers 2500 and 2600 may be disposed to correspond to first and second regions 2210 and 2220 of the heater 2200 respectively, and a first heat conductive layer 2500 may be disposed on the first region 2210, and a second heat conductive layer 2600 may be disposed on the second region 2220. A through-hole TH2 may be formed in the bonding head 2300, a coolant supply portion 2400 supplying a coolant to the through-hole TH2, and only the first region 2210 may be selectively cooled, such that the temperature of the first region 2210 may be lower than the temperature of the second region 2220. The first and second conductive layers 2500 and 2600 may be made of the same material, but in certain embodiments, the first heat conductive layer 2500 may be made of a material having thermal conductivity higher than that of the second heat conductive layer 2600 in order to quickly transmit heat from the first region 2210 to the coolant, thereby enhancing a cooling effect of the coolant supply portion 2400. In addition, the second heat conductive layer 2600 may be made of an insulating material for blocking/reducing heat transfer to the bonding head 2300.

Components described as thermally connected or in thermal communication are arranged such that heat will follow a path between the components to allow the heat to transfer from the first component to the second component. Simply because two components are part of the same device or package does not make them thermally connected. In general, components which are heat-conductive and directly connected to other heat-conductive or heat-generating components (or connected to those components through intermediate heat-conductive components or in such close proximity as to permit a substantial transfer of heat) will be described as thermally connected to those components, or in thermal communication with those components. On the contrary, two components with heat-insulative materials therebetween, which materials significantly prevent heat transfer between the two components, or only allow for incidental heat transfer, are not described as thermally connected or in thermal communication with each other. The terms "heat-conductive" or "thermally-conductive" do not apply to a particular material simply because it provides incidental heat conduction, but are intended to refer to materials that are typically known as good heat conductors or known to have utility for transferring heat, or components having similar heat conducting properties as those materials.

Compared with the example embodiment described above with respect to FIG. 12, the chip bonding apparatus 3010 of FIG. 13 is different in that a central region of the first heat conductive layer 3500 is removed to form a cavity 3700, and a through-hole TH3 is connected to the cavity 3700 and the coolant supplied from the coolant supply portion 3400 is supplied to the cavity 3700. For example, the first heat conductive layer 3500 may have an opening in its central area. Since the coolant is directly supplied to the cavity 3700, there may be an advantage in that a cooling speed is faster than a case in which a coolant passes through the bonding head 2300 as shown in FIG. 13. Other parts are the same as those of the above-described example embodiment shown in FIG. 13, so a detailed description thereof will be omitted.

According to an embodiment of the present disclosure, a method of manufacturing a semiconductor device using the above described chip bonding apparatus is provided. First, the semiconductor chips C1, C2 and C2 described above may be manufactured by a wafer fabricating processes and then may be divided into semiconductor chips C1, C2 and C3. The wafer fabricating processes may include providing a substrate and forming various semiconductor device elements, e.g., transistors, resistors, etc. on the substrate in a front end of line (FEOL) process. Various connection lines and via holes connecting the various semiconductor device elements may be formed above the semiconductor device elements on the substrate in a back end of line (BEOL) process. The substrate may be a semiconductor wafer. After forming pads and passivation layers on the substrate, the substrate may be divided into semiconductor chips. After the semiconductor chips are fabricated, the semiconductor chips are bonded on a substrate W by a chip bonding apparatus described in one of the embodiments of the present disclosure. In a chip bonding process, a wafer W may be mounted on a stage CT of a chip bonding apparatus, and then semiconductor chips C1, C2 and C3 may be disposed on the substrate W for the solder bumps B and bonding films F to be respectively interposed between the semiconductor chips C1, C2 and C3 and the substrate W. The semiconductor chips C1, C2 and C3 may be bonded on the substrate W by a thermocompression process as described above. After the semiconductor chips C1, C2 and C3 are bonded on the substrate W, the substrate W may be divided into multiple pieces to be packaged into a plurality of semiconductor devices or the substrate W may be packaged as a whole to make a semiconductor device. For example, the semiconductor chips C1, C2 and C3 may be packaged in a semiconductor device in one embodiment, or may be packaged in different semiconductor devices in another embodiment.

As set forth above, according to the present inventive concept, a chip bonding apparatus and a method of manufacturing a semiconductor device using the chip bonding apparatus have been provided. The apparatus and the method may reduce deformation of a semiconductor chip bonded by the apparatus and the method, and/or may reduce a bonding failure of the semiconductor devices.

Various and beneficial advantages and effects of the present inventive concept are not limited to the above description, and may be more easily understood in the course of applying specific embodiments of the present inventive concept.

While the example embodiments have been shown and described above, it will be apparent to those skilled in the art that modifications and variations could be made without departing from the scope of the present invention as defined by the appended claims.

What is claimed is:

1. A chip bonding apparatus, comprising:
a bonding contact configured to apply a bonding force to a semiconductor chip disposed on a substrate, the bonding contact having a first surface configured to face the semiconductor chip and a second surface opposite the first surface, the bonding contact including a protruding portion on the first surface, the protruding portion configured to contact the semiconductor chip, the bonding contact including a cavity formed in a region vertically overlapping the protruding portion;
a heater disposed to be in contact with the second surface of the bonding contact to cover the cavity, and configured to heat the bonding contact;
a bonding head disposed above the heater and configured to transmit the bonding force; and
a partition wall structure protruding from a bottom surface of the cavity to partition an inner space of the cavity,
wherein an upper surface of the partition wall structure is at a lower level than that of the second surface of the bonding contact,
wherein the cavity has a depth of 0.5 mm to 1.5 mm, and the partition wall structure is at a level of 0.2 mm to 0.5 mm lower than the second surface of the bonding contact.

2. The chip bonding apparatus of claim 1, wherein the partition wall structure has a cross or lattice shape, each partition wall of the partition wall structure connecting a pair of sidewalls facing each other.

3. The chip bonding apparatus of claim 1, wherein the cavity has an area smaller than that of the protruding portion in a plan view.

4. The chip bonding apparatus of claim 1, wherein the bottom surface of the cavity is formed of any one of a flat surface, an inclined surface, and a concave surface.

5. The chip bonding apparatus of claim 4, wherein the inclined surface and the concave surface are inclined downwardly in a direction approaching a central region of the bottom surface of the cavity.

6. The chip bonding apparatus of claim 1, wherein at least one of air, nitrogen gas, and argon gas is filled in the cavity.

7. The chip bonding apparatus of claim 1, further comprising a through-hole penetrating through the bonding head and the heater and connected to the cavity; and
a pressure supply connected to the through-hole, the pressure supply configured to adjust pressure inside the cavity.

8. A chip bonding apparatus, comprising:
a bonding tool configured to contact an object to be bonded and having a surface having a first region in which a cavity is formed and a second region disposed at a periphery of the first region;
a heater disposed to be in contact with the surface to cover the cavity of the bonding tool and configured to heat the bonding tool; and
a partition wall structure protruding from a bottom surface of the cavity to partition an internal space of the cavity into a plurality of regions, the partition wall structure positioned at a lower level than the surface,
wherein the cavity is closed from outside by bottom and side portions of a body portion that forms the bonding tool,
wherein the bonding tool comprises a protruding portion protruding downwards and configured to contact the object to be bonded,
wherein the cavity has a depth of 0.5 mm to 1.5 mm, and wherein the partition wall structure is at a level of 0.2 mm to 0.5 mm lower than the surface of the bonding tool.

9. The chip bonding apparatus of claim 8,
wherein a depth of the cavity is greater than a thickness, in a vertical direction, of an edge of the body portion.

10. The chip bonding apparatus of claim 8, wherein the partition wall structure is formed in a rotationally symmetrical manner with respect to the center of the cavity.

11. The chip bonding apparatus of claim 1, wherein a vertical distance between the bottom surface of the protruding portion and the bottom surface of the cavity is less than a vertical distance between the bottom surface of the cavity and the second surface of the bonding contact.

12. The chip bonding apparatus of claim 1, wherein the cavity has a shape corresponding to a shape of the protruding portion.

* * * * *